(12) United States Patent
Lopatin et al.

(10) Patent No.: US 6,900,488 B1
(45) Date of Patent: May 31, 2005

(54) MULTI-CELL ORGANIC MEMORY ELEMENT AND METHODS OF OPERATING AND FABRICATING

(75) Inventors: Sergey D. Lopatin, Santa Clara, CA (US); Mark S. Chang, Los Altos, CA (US); Minh Van Ngo, Fremont, CA (US); Patrick K. Cheung, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 125 days.

(21) Appl. No.: 10/284,946

(22) Filed: Oct. 31, 2002

(51) Int. Cl.[7] .............................................. H01L 29/76
(52) U.S. Cl. .................................... 257/295; 257/310
(58) Field of Search ............................ 257/296–295, 257/72

(56) References Cited
U.S. PATENT DOCUMENTS 6,380,574 B1 * 4/2002 Torii et al. .................. 257/295

* cited by examiner

Primary Examiner—Dung A. Le
(74) Attorney, Agent, or Firm—Amin & Turocy, LLP

(57) ABSTRACT

The present invention provides a multi-cell organic memory device that can operate as a non-volatile memory device having a plurality of multi-cell structures constructed within the memory device. A lower electrode can be formed, wherein one or more passive layers are formed on top of the lower electrode. An Inter Layer Dielectric (ILD) is formed above the passive layers and lower electrode, whereby a via or other type relief is created within the ILD and an organic semiconductor material is then utilized to partially fill the via above the passive layer. The portions of the via that are not filled with organic material are filled with dielectric material, thus forming a multi-dimensional memory structure above the passive layer or layers and the lower electrode. One or more top electrodes are then added above the memory structure, whereby distinctive memory cells are created within the organic portions of the memory structure and activated (e.g., read/write) between the top electrodes and bottom electrode, respectively. In this manner, multiple storage cells can be formed within a singular organic structure thereby increasing memory device density and storage.

31 Claims, 10 Drawing Sheets

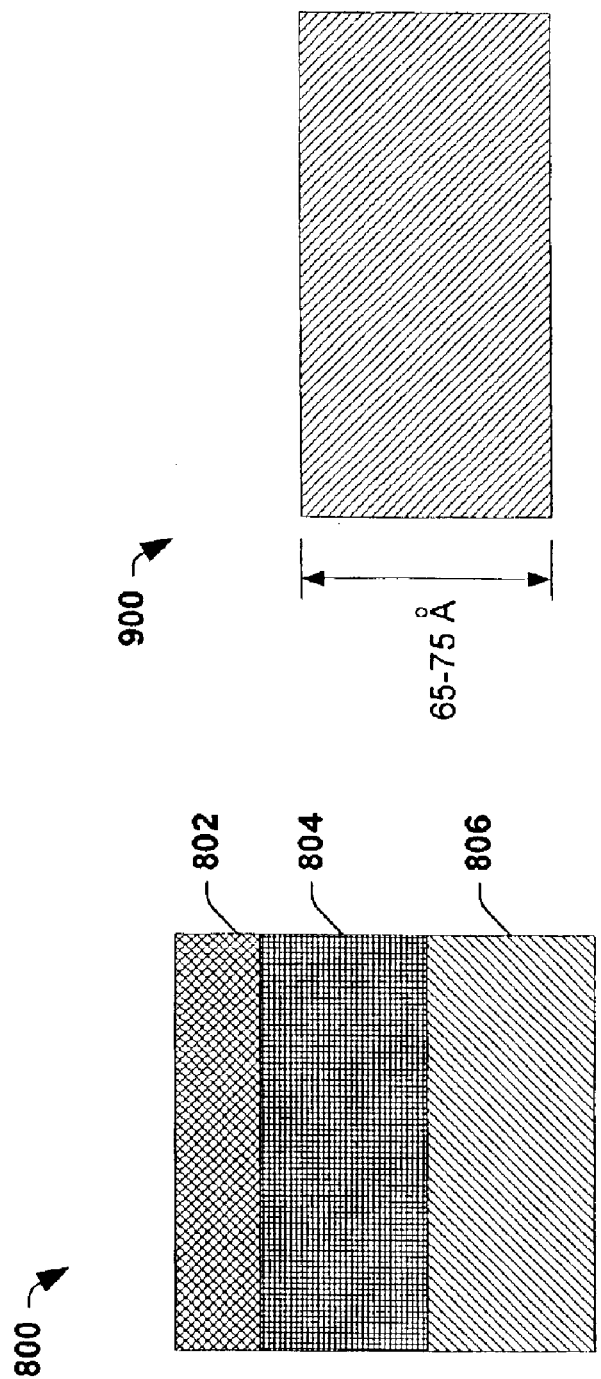

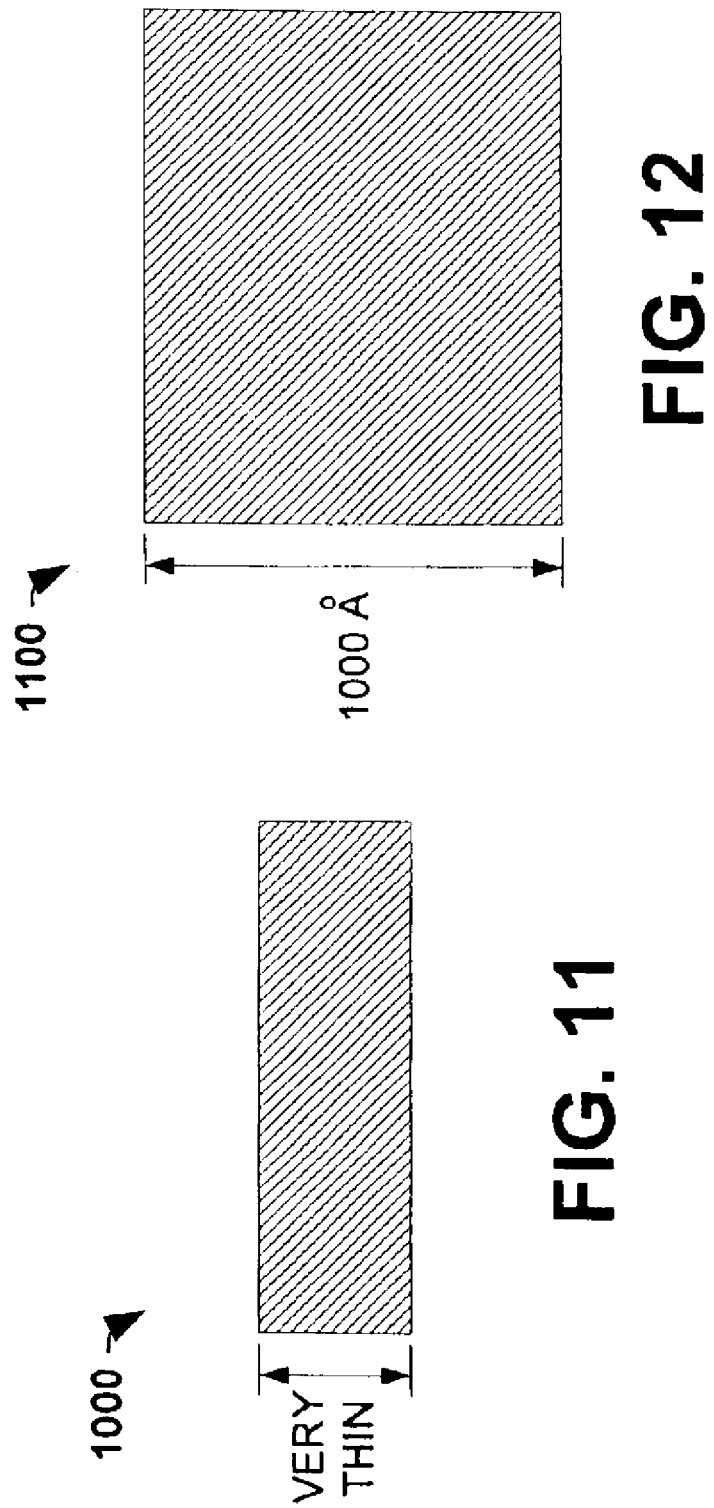

MULTI-CELL ORGANIC MEMORY ELEMENT AND METHODS OF OPERATING AND FABRICATING

FIELD OF INVENTION

The present invention relates generally to organic memory devices having polymer films and, in particular, to multi-cell organic memory devices containing an organic semiconductor.

BACKGROUND OF THE INVENTION

The volume, use and complexity of computers and electronic devices are continually increasing. Computers consistently become more powerful, new and improved electronic devices are continually developed (e.g., digital audio players, video players). Additionally, the growth and use of digital media (e.g., digital audio, video, images, and the like) have further pushed development of these devices. Such growth and development has vastly increased the amount of information desired/required to be stored and maintained for computer and electronic devices.

Memory devices generally include arrays of memory cells. Each memory cell can be accessed or "read", "written", and "erased" with information. The memory cells maintain information in an "off" or an "on" state (e.g., are limited to 2 states), also referred to as "0" and "1". Typically, a memory device is addressed to retrieve a specified number of byte(s) (e.g., 8 memory cells per byte). For volatile memory devices, the memory cells must be periodically "refreshed" in order to maintain their state. Such memory devices are usually fabricated from semiconductor devices that perform these various functions and are capable of switching and maintaining the two states. The devices are often fabricated with inorganic solid state technology, such as, crystalline silicon devices. A common semiconductor device employed in memory devices is the metal oxide semiconductor field effect transistor (MOSFET).

Because of the increasing demand for information storage, memory device developers and manufacturers are constantly attempting to increase storage capacity for memory devices (e.g., increase storage per die or chip). A postage-stamp-sized piece of silicon may contain tens of millions of transistors, each transistor as small as a few hundred nanometers. However, silicon-based devices are approaching their fundamental physical size limits. Inorganic solid-state devices are generally encumbered with a complex architecture which leads to high cost and a loss of data storage density. The volatile semiconductor memories based on inorganic semiconductor material must constantly be supplied with electric current with a resulting heating and high electric power consumption in order to maintain stored information. Non-volatile semiconductor devices have a reduced data rate and relatively high power consumption and large degree of complexity.

Moreover, as the size of inorganic solid-state devices decreases and integration increases, sensitivity to alignment tolerances increases making fabrication markedly more difficult. Formation of features at small minimum sizes does not imply that the minimum size can be used for fabrication of working circuits. It is necessary to have alignment tolerances which are much smaller than the small minimum size, for example, one quarter the minimum size.

Scaling inorganic solid-state devices raises issues with dopant diffusion lengths. As dimensions are reduced, the dopant diffusion lengths in silicon are posing difficulties in process design. In this connection, many accommodations are made to reduce dopant mobility and to reduce time at high temperatures. However, it is not clear that such accommodations can be continued indefinitely. Furthermore, applying a voltage across a semiconductor junction (in the reverse-bias direction) creates a depletion region around the junction. The width of the depletion region depends on the doping levels of the semiconductor. If the depletion region spreads to contact another depletion region, punch-through or uncontrolled current flow, may occur.

Higher doping levels tend to minimize the separations required to prevent punch-through. However, if the voltage change per unit distance is large, further difficulties are created in that a large voltage change per unit distance implies that the magnitude of the electric field is large. An electron traversing such a sharp gradient may be accelerated to an energy level significantly higher than the minimum conduction band energy. Such an electron is known as a hot electron, and may be sufficiently energetic to pass through an insulator, leading to irreversibly degradation of a semiconductor device.

Scaling and integration makes isolation in a monolithic semiconductor substrate more challenging. In particular, lateral isolation of devices from each other is difficult in some situations. Another difficulty is leakage current scaling. Yet another difficulty is presented by the diffusion of carriers within the substrate; that is free carriers can diffuse over many tens of microns and neutralize a stored charge. Thus, further device shrinking and density increasing may be limited for inorganic memory devices. One possible to way to solve the problem is to use polymer films for the memory elements. Furthermore, such device shrinkage for inorganic non-volatile memory devices while meeting increased performance demands is particularly difficult, especially while maintaining low costs.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The present invention relates to systems and methods for fabricating multi-cell organic semiconductor memory devices. Multi-dimension memory structures composed of organic material such as polymer are formed within an Inter Layer Dielectric (ILD) of an organic semiconductor memory device. The structures can be substantially any shape such as cylindrical and are typically formed in a void in the ILD such as through a via or other type relief. The structures are formed over a passive layer which in turn is formed over a conductive material such as copper. After the memory structures are formed over the passive and conductive layers, respectively, one or more conductive electrodes can be placed over various portions of the memory structures to form one or more memory cells within selected portions of the memory structure. In this manner, memory device utilization, density, and packing can be substantially improved. The memory cells are activated by the applying voltages to the underlying passive and conductive layers and the conductive electrodes formed above the memory structure, wherein bits can be stored in the form of a 0, 1 or other impedance state within the selected portions or the memory structure.

The memory structures and associated memory cells can be employed to provide multi-cell organic memory devices that utilize an organic conductor that facilitates migration of charge (e.g., electrons, holes). The present invention provides organic memory devices that possess at least one or more of the following: small size compared to inorganic memory devices, capability to store multiple bits of information, short resistance/impedance switch time, low operating voltages, low cost, high reliability, long life (thousands/millions of cycles), capable of three dimensional packing, associated low temperature processing, light weight, high density/integration, and extended memory retention.

A multi-cell organic memory component can be constructed with two or more electrodes having a selectively conductive media between the electrodes. The selectively conductive media is formed in various portions of the memory structures described above. The selectively conductive media contains an organic conductor layer and one or more passive layers. The selectively conductive media is programmed (e.g., written) by applying bias voltages that programs a desired impedance state into the memory cell. The desired impedance state represents one or more bits of information and does not require a constant power supply or refresh cycles to maintain the desired impedance state. The impedance state of the selectively conductive media is read by applying a current and then reading the impedance of the selectively conductive media. As with the written impedance state, the read impedance state represents one or more bits of information. Additionally, methods of fabricating the organic memory devices/cells, methods of using the organic memory devices/cells, and devices such as computers containing the organic memory devices/cells are also provided.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 9 is a block diagram of a passive layer that can be employed in an organic memory device in accordance with an aspect of the present invention.

FIG. 10 is a block diagram illustrating an organic polymer layer formed by a spin coating process in accordance with an aspect of the present invention.

FIG. 11 is a block diagram illustrating another organic polymer layer formed by a CVD process in accordance with an aspect of the present invention.

FIG. 12 is a block diagram of yet another polymer layer formed by a CVD process in accordance with an aspect of the present invention.

DETAILED DESCRIPTION OF THE INVENTION

The present invention provides a multi-cell organic memory device that can operate as a non-volatile memory device having a plurality of multi-cell memory structures constructed within the memory device. A lower electrode can be formed such as from a single or dual damascene process, wherein one or more passive layers are formed on top of the lower electrode. An Inter Layer Dielectric (ILD) is formed above the passive layers and lower electrode, whereby a via or other type relief is created within the ILD and an organic semiconductor material is then utilized to partially fill the via above the passive layer. The portions of the via that are not filled with organic material are filled with dielectric material, thus forming a multi-dimensional memory structure above the passive layer or layers and the lower electrode. One or more top electrodes are then added above the memory structure, whereby distinctive memory cells are created within the organic portions of the memory structure and activated (e.g., read/write) between the top electrodes and bottom electrode, respectively. In this manner, multiple storage cells can be formed within a singular organic structure thereby increasing memory device density and storage.

The cells of the multi-cell organic memory device are operative to be of two or more states corresponding to various levels of impedance. These states can be set by applying a bias voltage and then the cells remain in their respective states until another voltage, in reverse bias, is applied. The cells maintain their states with or without power (e.g., non-volatile) and can be read either electrically or optically by measuring injection current or light emission. The organic memory device of the present invention facilitates increases in device density while also increasing device performance relative to conventional inorganic memory devices.

Figure 1:
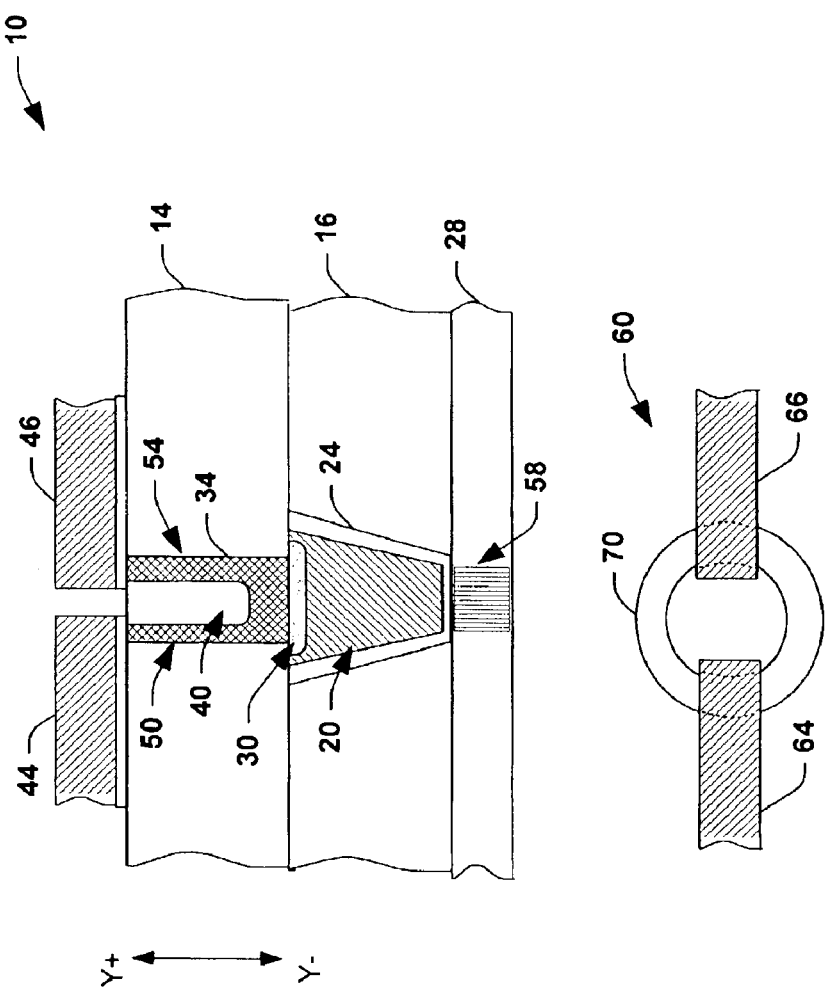
FIG. 1 is a cut-away view diagram of a multi-cell organic memory device in accordance with an aspect of the present invention.

Referring initially to FIG. 1, a cut-away view illustrates a multi-cell memory device 10 (also referred to as memory device 10) in accordance with an aspect of the present invention. For illustrative purposes, a dual cell structure is first described for the memory device 10 although it is to be appreciated that multiple memory structures having multiple memory cells can be created in accordance with the present invention as will be described in more detail below. The memory device 10 includes various dielectric layers such as a layer 14 and layer 16, wherein such layers are also referred to as an Inter Layer Dielectric (ILD). Such layers 14 and 16 can be low K dielectric material, for example, and/or substantially any type material having dielectric properties.

Within layer 16, a lower electrode 20 is formed having an associated barrier layer 24 that mitigates diffusion of the lower electrode 20 into a subsequent layer 28. Above the lower electrode 20, a passive layer 30 is formed. The lower electrode 20 and associated passive layer (or layers) 30 cooperate as a common activation or access element for the multi-cell memory device 10 described herein.

After the passive layer 30 has been added, the dielectric layer 14 is added above the layer 16. Organic semiconductor material 34 (e.g., polymer) is formed within the layer 14, wherein the material 34 is partially filled with a dielectric material 40. As illustrated, two conductive electrodes 44 and 46 are formed above the organic material 34 (can also include barrier layers between top electrodes and organic material), whereby memory cells 50 and 54 are formed in vertical portions (Y+ and Y− directions) of the organic material 34. Thus, if a suitable voltage is applied between electrode 44 and electrode 20, a storage state (e.g., 1, 0, other impedance state) can be stored in (or read from) the memory cell 50, whereas if a suitable voltage is applied between electrode 46 and electrode 20, a storage state can be stored in (or read from) the memory cell 54.

As noted above, multiple electrodes can be formed above the organic material 34 to form more than two memory cells and will be described in more detail below. Moreover, a plurality of such multi-cell memory devices 10 can be manufactured in accordance with an Integrated Circuit (IC) memory device (e.g., 1 Mbit, 2 Mbit, 8 Mbit storage cells, . . . and so forth, constructed as a non-volatile memory IC). In addition, common-word lines such as illustrated at 58 in layer 28 can be provided to store, erase, read, and write a plurality of multi-cell structures in accordance with the present invention (e.g., 8/16 byte/word erase, read, write).

Referring briefly to reference numeral 60 of FIG. 1, a top view illustrates the dual cell structure of the memory device 10. Electrodes 64 and 66 are analogous to the electrodes 44 and 46 described above. As can be observed from the top of the structure 60, a cylinder shape (or multi-dimension) structure 70 is formed from the combination of organic material 34 and dielectric material 40 described above. It is to be appreciated however, that various shapes can be formed from such combination (or combinations) and will be described in more detail below. Furthermore, the components 14 through 70 can be constructed from a plurality of materials and processes and also will be described in more detail below.

Figure 2:
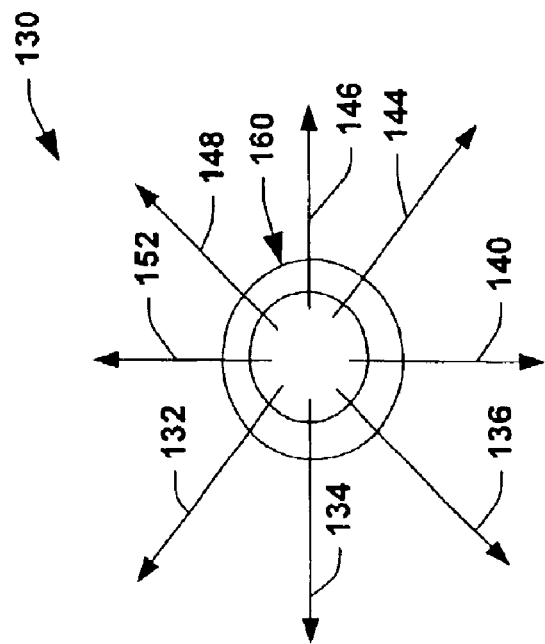
FIG. 2 is a diagram illustrating multiple cell storage and access in accordance with an aspect of the present invention.
Figure 2:
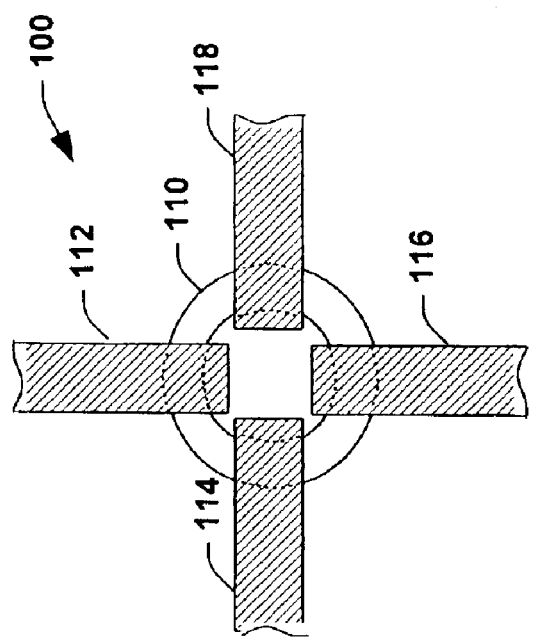

Referring now to FIG. 2, a structure 100 illustrates a top-view of a quad cell memory device in accordance with an aspect of the present invention. The structure 100 includes an organic member 110 having electrodes 114 through 118 positioned above. Thus, if electrode 114 is energized in accordance with a lower electrode (not shown), a bit can be stored within or retrieved from about ¼ of the organic member 110. Similarly, bits can be stored or retrieved from other portions of the organic member 110 via electrodes 116 through 118 and associated lower electrode. As noted above with the dual cell structure, the quad cell structure 100 can also be increased whereby multiple electrodes (e.g., more than four) are formed over the structure 100. For example, a structure 130 illustrates an eight-cell storage unit, wherein arrows 132 through 152 represent electrodes for storing or retrieving eight units of information within the an organic member 160. It is to be appreciated that more or less storage cells can be created within an organic member or structure than what has been illustrated in FIGS. 1 and 2 in accordance with the present invention. For example, an odd cell-structure can be formed if desired, wherein the number of electrodes form an odd number of memory regions within an organic structure or member (e.g., 23 storage bits formed within an organic member).

Figure 3:
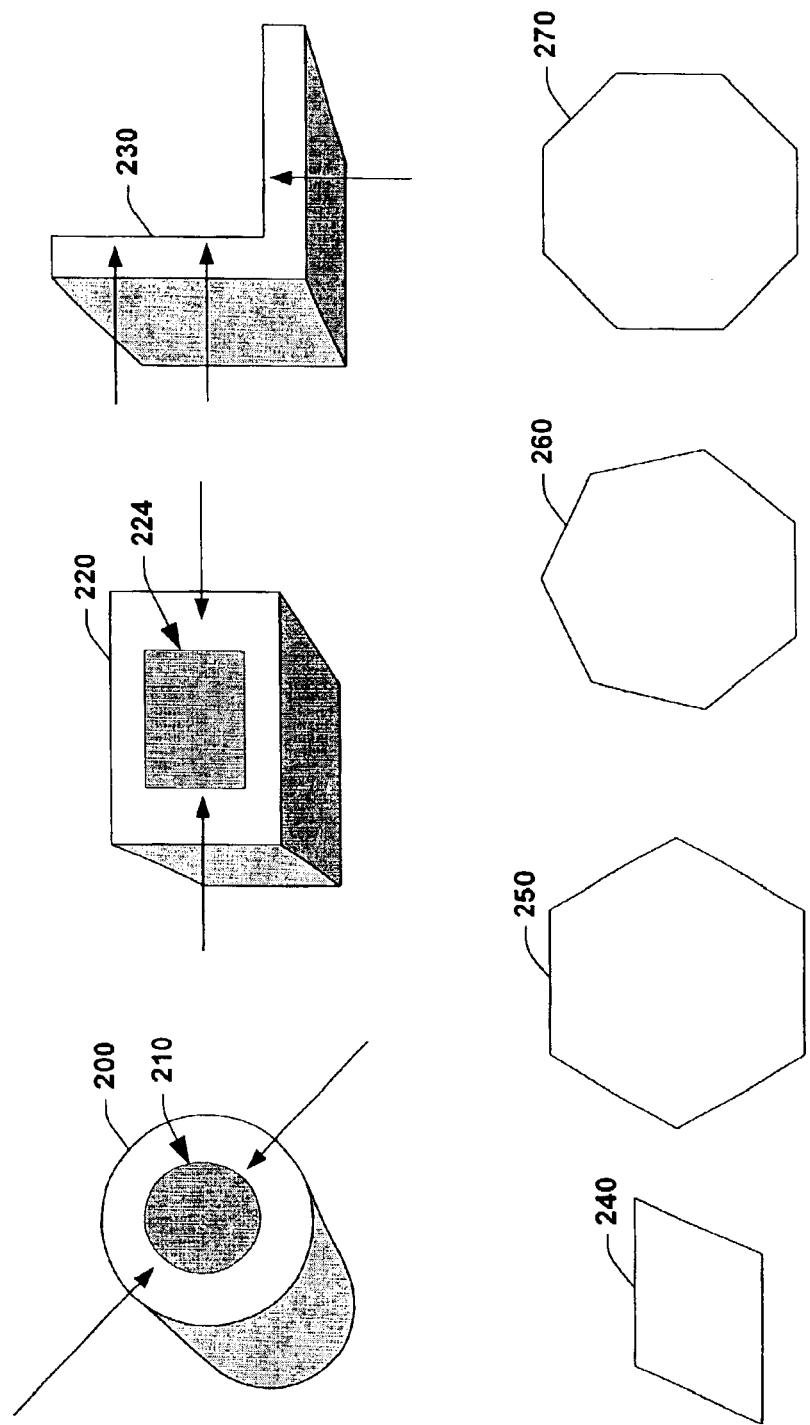
FIG. 3 illustrates a plurality of variously constructed and exemplary organic memory cells in accordance with an aspect of the present invention.

Turning to FIG. 3, a plurality of variously constructed and exemplary organic memory cells are illustrated in accordance with an aspect of the present invention. A cylindrical organic structure 200 is illustrated in a three-dimensional view, whereby arrows are illustrative of electrodes (two shown as example) for storing and retrieving information within the structure 200. Within the structure 200, is a dielectric material 210 as noted above in FIG. 1. As will be described in more detail below, the structure 200 can be formed within a via or other type opening within an ILD. However, it is to be appreciated that a plurality of other types of shapes or structures can be employed in accordance with the present invention. For example, a cubic organic structure 220 can be provided having a dielectric material 224 formed therein. At 230, an angular structure is formed and depicted with three arrows illustrating exemplary storage portions within the structure 230. To illustrate further examples, a top view of a trapezoidal organic structure is depicted at 240, a hexagonal structure is illustrated at 250, a heptagonal structure is illustrated at 260, and an octagonal structure is illustrated at 270. As can be appreciated, other shapes and dimensions can be constructed or formed having multiple storage portions in accordance with the present invention.

Figure 4:
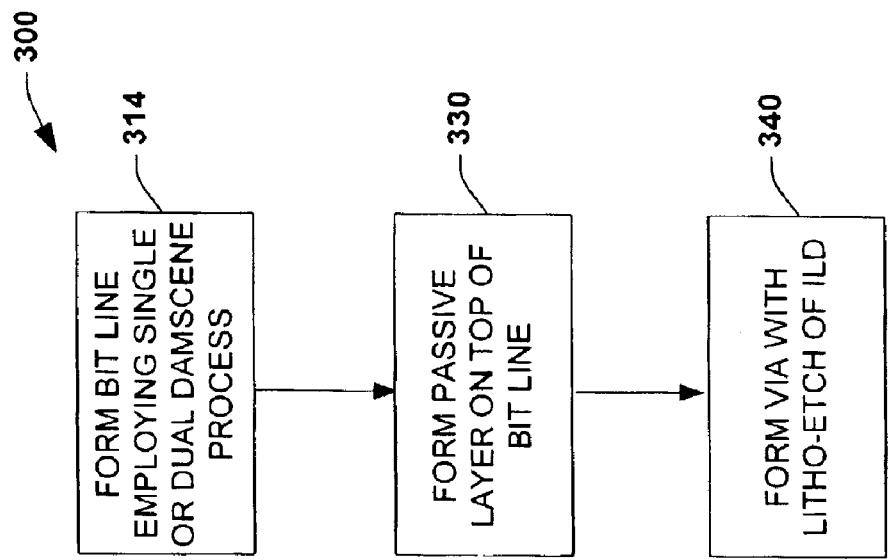
FIG. 4 is a flow diagram and associated structure illustrating a portion of a process for fabricating a multi-cell memory device in accordance with an aspect of the present invention.
Figure 4:
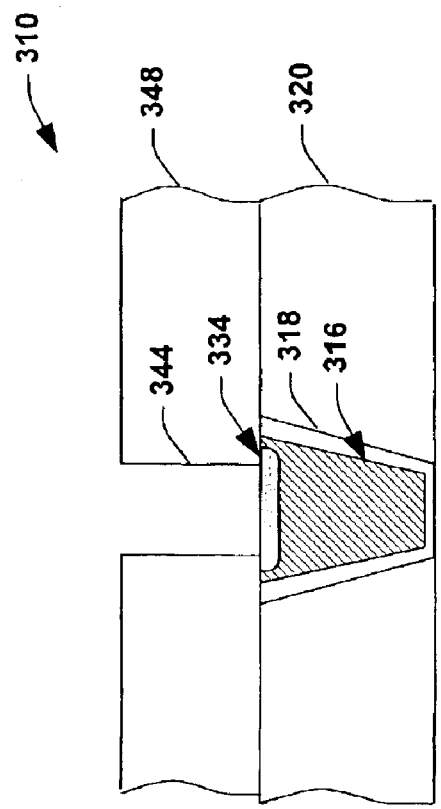
Figure 5:
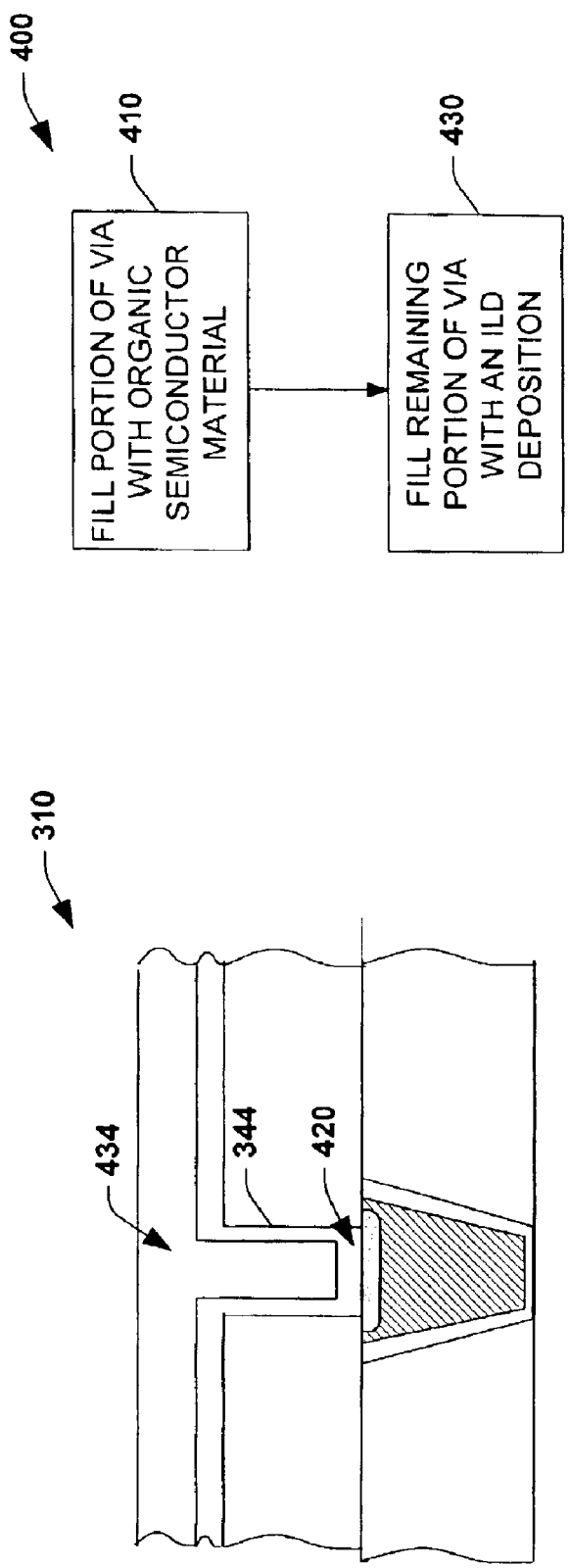
FIG. 5 is a flow diagram and associated structure illustrating a continuation of the process depicted in FIG. 4 for a multi-cell memory structure in accordance with an aspect of the present invention.
Figure 6:
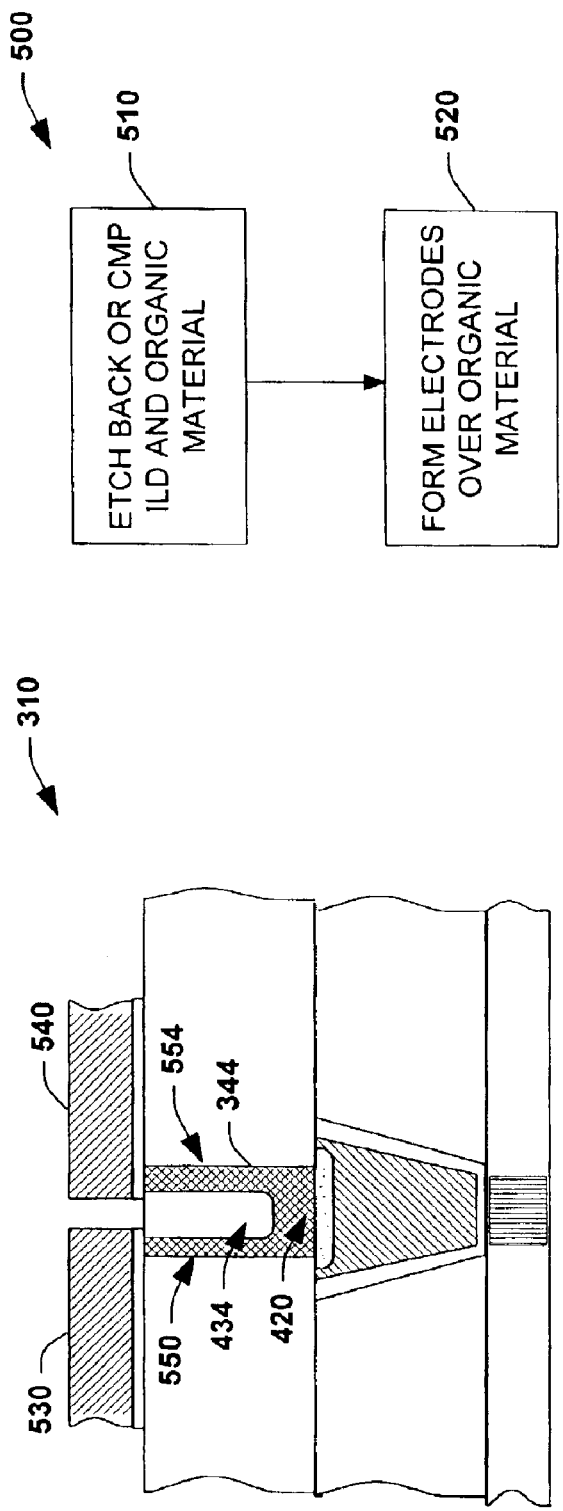
FIG. 6 is a flow diagram and associated structure illustrating a continuation of the process depicted in FIG. 5 for a multi-cell memory structure in accordance with an aspect of the present invention.

FIGS. 4 through 6 illustrate devices and associated methodologies to facilitate multi-cell memory fabrication in accordance with the present invention. While, for purposes of simplicity of explanation, the methodologies may be shown and described as a series of acts, it is to be understood and appreciated that the present invention is not limited by the order of acts, as some acts may, in accordance with the present invention, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the present invention.

Referring now to FIG. 4, a diagram 300 illustrates a portion of a process for fabricating a multi-cell memory device 310 in accordance with the present invention. Before proceeding with a description of the process 300 and associated structure 310, it is noted that exemplary materials and process steps will be described. However, it is to be appreciated that the present invention is not so limited. Thus, a plurality of alternative materials and/or compounds will be described in more detail below that can be employed in accordance with the present invention. Proceeding to 314, a Cu bit line or lower electrode having an associated barrier is formed in accordance with a single or dual damascene process as is well understood. The bit line is illustrated at 316 of structure 310 and the barrier is illustrated at 318 of structure 310, and are formed in an ILD layer 320. The barrier 318 is employed to substantially prevent copper or other conductive material from diffusing into other layers. As an example, the barrier 318 can be formed as a metallic (e.g., tantalum) diffusion barrier. Such barrier materials that can be utilized are cobalt, chromium, nickel, palladium, tantalum, tantalum silicon nitride, titanium, titanium nitride, silicon nitride, tungsten nitride, and tungsten silicon nitride, for example.

At 330, a passive layer such as $Cu_2S$, for example, can be formed on the bit line 316. The passive layer is illustrated at 334 of the structure 310. At 340, a via or other type opening 344 is formed in an ILD layer 348—above the passive layer 334. The via 344 can be formed in accordance with a lithographic etch technique, for example, and/or other process for removing portions of the ILD layer 348.

FIG. 5 illustrates a continuation of the process depicted in FIG. 4 for a multi-cell memory structure in accordance with an aspect of the present invention, wherein a process 400 illustrates aspects for forming a multi-bit organic memory cell. Proceeding to 410, a portion of the via 344 is filled with an organic material deposition such as a polymer although other organic materials can be employed as will be described below. The organic material or compound is illustrated at 420 and fills or is conformal with about one half of the via 344, although other fill ratios are possible (e.g., 1/4, 1/3, 2/3, 3/4). At 430 of the process 400, the remaining portion of the via 344 is filled with an ILD deposition and is illustrated at 434 of the structure 310.

FIG. 6 illustrates a continuation of the process depicted in FIG. 5 for a multi-cell memory structure in accordance with an aspect of the present invention, wherein a process 500 illustrates aspects for forming a multi-bit organic memory cell. Proceeding to 510, the organic material 420 and ILD layer 434 described above is etched back to a substantially flat surface in accordance with a surface planarization process or chemical mechanical polish (CMP) process as is well understood. At 520, electrodes 530 and 540 (two shown for illustrative purposes) having an associated barrier are formed over the organic material 420 via a single or dual damascene process. Thus, in this example, memory cells are formed at vertical portions 550 and 554 respectively, in the organic material 420.

Figure 7:
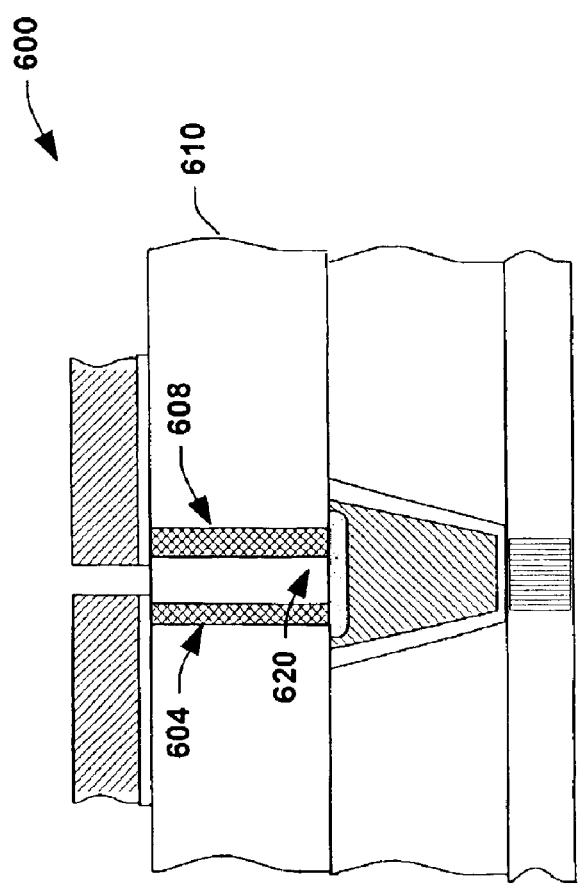
FIG. 7 illustrates an alternative multi-cell memory structure in accordance with an aspect of the present invention.

FIG. 7 illustrates an alternative multi-cell memory structure 600 in accordance with an aspect of the present invention. In this aspect, multiple vias 604 and 608 may be formed in an ILD 610, wherein organic material fills the respective vias—thus, forming column-like structures and/or planes. The filled vias then form memory cells, which may also be separated by an ILD material 620 in accordance with a singular bottom electrode and multiple top electrodes or conductive materials as previously described. As can be appreciated a plurality of such filled vias can be formed between the bottom electrode and associated top electrodes to form more than the two exemplary memory cells depicted by the structure 600.

FIGS. 8–12 illustrate alternative materials and processes that may be employed in accordance with an aspect of the present invention. Accordingly, such components that have been previously described such as electrodes, conductive materials, passive layers, organic materials/layers, and processes for fabricating the same will now be described in more detail and in accordance with alternative aspects of the present invention.

Figure 8:
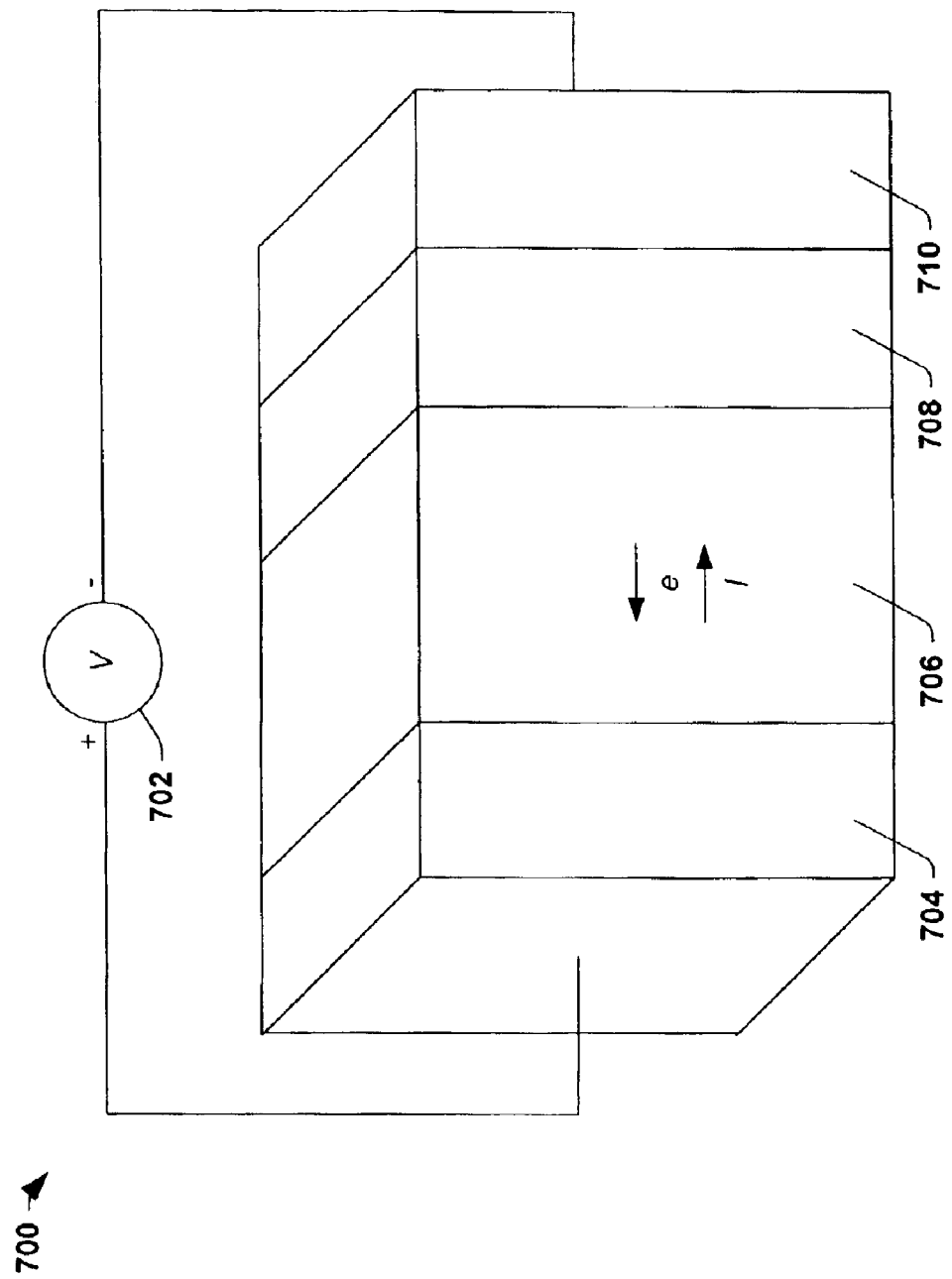
FIG. 8 is a 3-D diagram of an organic memory device in accordance with an aspect of the present invention.

Referring to FIG. 8, a 3-D diagram of an organic memory device 700 in accordance with an aspect of the present invention is depicted. The memory device includes a first electrode 704, an organic polymer layer 706, a passive layer 708 and a second electrode 710. The diagram also illustrates a voltage source 702 connected to the first electrode 704 and the second electrode 710 that applies a voltage on the first electrode 704 and the second electrode 710. For illustrative purposes, a single first electrode is described. It is to be appreciated however than multiple electrodes having similar properties as the first electrode 704 can be provided in a multi-cell organic memory as previously described above.

The first electrode 704 (or multiple first electrodes) and the second electrode 710 are comprised of a conductive material such as, copper or copper alloy, silver alloy. Other materials can be aluminum, chromium, germanium, gold, magnesium, manganese, indium, iron, nickel, palladium, platinum, titanium, zinc, alloys thereof, indium-tin oxide, polysilicon, doped amorphous silicon, metal silicides, and the like. Exemplary alloys that can be utilized for the conductive material include copper-silver alloy, copper-zinc alloy. Other materials can be Hastelloy®, Kovar®, Invar, Monel®, Inconel®, brass, stainless steel, magnesium-silver alloy, and various other alloys.

The thickness of the first electrode 704 and the second electrode 710 can vary depending on the implementation and the memory device being constructed. However, some exemplary thickness ranges include about 0.01 $\mu$m or more and about 10 $\mu$m or less, about 0.05 $\mu$m or more and about 5 $\mu$m or less, and/or about 0.1 $\mu$m or more and about 1 $\mu$m or less.

The organic layer 706 and the passive layer 708 are collectively referred to as a selectively conductive media or selectively conductive layer. The conductive properties of this media (e.g., conductive, non-conductive, semi-conductive) can be modified in a controlled manner by applying various voltages across the media via the electrodes 704 and 710.

The organic layer 706 is comprised of a conjugated organic material. If the organic layer is polymer, a polymer backbone of the conjugated organic polymer may extend lengthwise between the electrodes 704 and 710 (e.g., generally substantially perpendicular to the inner, facing surfaces of the electrodes 704 and 710). The conjugated organic molecule can be linear or branched such that the backbone retains its conjugated nature. Such conjugated molecules are characterized in that they have overlapping $\pi$ orbitals and that they can assume two or more resonant structures. The conjugated nature of the conjugated organic materials contributes to the controllably conductive properties of the selectively conductive media.

In this connection, the conjugated organic material has the ability to donate and accept charges (holes and/or electrons). Generally, the conjugated organic molecule has at least two relatively stable oxidation-reduction states. The two relatively stable states permit the conjugated organic polymer to donate and accept charges and electrically interact with the conductivity facilitating compound.

The organic material may be cyclic or acyclic. For some cases, such as organic polymers, the organic material self assembles between the electrodes during formation or deposition. Examples of conjugated organic polymers include one or more of polyacetylene (cis or trans); polyphenylacetylene (cis or trans); polydiphenylacetylene; polyaniline; poly(p-phenylene vinylene); polythiophene; polyporphyrins; porphyrinic macrocycles, thiol derivatized polyporphyrins; polymetallocenes such as polyferrocenes, polyphthalocyanines; polyvinylenes; polystiroles; and the like. Additionally, the properties of the organic material can be modified by doping with a suitable dopant (e.g., salt).

The organic layer 706 has a suitable thickness that depends upon the chosen implementations and/or the memory device being fabricated. Some suitable exemplary ranges of thickness for the organic polymer layer 706 are about 0.001 $\mu$m or more and about 5 $\mu$m or less, about 0.01 $\mu$m or more and about 2.5 $\mu$m or less, and about a thickness of about 0.05 $\mu$m or more and about 1 $\mu$m or less.

The organic layer 706 can be formed via a number of suitable techniques. One suitable technique that can be utilized is a spin-on technique which involves depositing a mixture of the material and a solvent, and then removing the solvent from the substrate/electrode. Another suitable technique is chemical vapor deposition (CVD). CVD includes low pressure chemical vapor deposition (LPCVD), plasma enhanced chemical vapor deposition (PECVD), and high density chemical vapor deposition (HDCVD). It is not typically necessary to functionalize one or more ends of the organic molecule in order to attach it to an electrode/passive layer. It may have a chemical bond formed between the conjugated organic polymer and the passive layer 708.

The passive layer 708 contains at least one conductivity facilitating compound that contributes to the controllably conductive properties of the selectively conductive media. The conductivity facilitating compound has the ability to donate and accept charges (holes and/or electrons). Generally, the conductivity facilitating compound has at least two relatively stable oxidation-reduction states. The two relatively stable states permit the conductivity facilitating compound to donate and accept charges and electrically interact with the organic layer 706. The particular conductivity facilitating compound employed is selected so that the two relatively stable states match with the two relatively stable states of the conjugated organic molecule of the layer 706.

The passive layer 708 can in some instances act as a catalyst when forming the organic layer 706. In this connection, the backbone of the conjugated organic molecule may initially form adjacent the passive layer 708, and grow or assemble away and substantially perpendicular to the passive layer surface. As a result, the backbones of the conjugated organic molecule may be self-aligned in a direction that traverses the two electrodes.

Examples of conductivity facilitating compounds that may make up the passive layer 708 include one or more of copper sulfide ($Cu_2S$, CuS), copper oxide (CuO, $Cu_2O$), manganese oxide ($MnO_2$), titanium dioxide ($TiO_2$), indium oxide ($I_3O_4$), silver sulfide ($Ag_2S$, AgS), iron oxide ($Fe_3O_4$), and the like. The passive layer 708 may be grown using oxidation techniques, formed via gas phase reactions, or deposited between the electrodes.

The passive layer 708 has a suitable thickness that can vary based on the implementation and/or memory device being fabricated. Some examples of suitable thicknesses for the passive layer 708 are as follows: a thickness of about 2 Å or more and about 0.1 $\mu$m or less, a thickness of about 10 Å or more and about 0.01 $\mu$m or less, and a thickness of about 50 Å or more and about 0.005 $\mu$m or less.

In order to facilitate operation of the organic memory device, the organic layer 706 is generally thicker than the passive layer 708. In one aspect, the thickness of the organic layer is from about 0.1 to about 500 times greater than the thickness of the passive layer. It is appreciated that other suitable ratios can be employed in accordance with the present invention.

The organic memory device, like conventional memory devices, can have two states, a conductive (low impedance or "on") state or non-conductive (high impedance or "off") state. However, unlike conventional memory devices, the organic memory device is able to have/maintain a plurality of states, in contrast to a conventional memory device that is limited to two states (e.g., off or on). The organic memory device can employ varying degrees of conductivity to identify additional states. For example, the organic memory device can have a low impedance state, such as a very highly conductive state (very low impedance state), a highly conductive state (low impedance state), a conductive state (medium level impedance state), and a non-conductive state (high impedance state) thereby enabling the storage of multiple bits of information in a single organic memory cell, such as 2 or more bits of information or 4 or more bits of information (e.g., 4 states providing 2 bits of information, 8 states providing 3 bits of information . . . ).

During typical device operation, electrons flow from the second electrode 710 through the selectively conductive media to the first electrode 704 based on a voltage applied to the electrodes by the voltage source 702 if the organic layer is n-type conductor. Alternately, holes flow from the first electrode 704 to second electrode 710 if the organic layer 706 is p-type conductor, or both electrons and holes flow in the organic layer if it can be both n and p type with proper energy band match with 708 and 710. As such, current flows from the first electrode 704 to the second electrode 710 via the selectively conductive media.

Switching the organic memory device to a particular state is referred to as programming or writing. Programming is accomplished by applying a particular voltage (e.g., 0.9 volts, 0.2 volts, 0.1 volts, . . . ) across the selectively conductive media via the electrodes 704 and 710. The particular voltage, also referred to as a threshold voltage, varies according to a respective desired state and is generally substantially greater than voltages employed during normal operation. Thus, there is typically a separate threshold voltage that corresponds to respective desired states (e.g., "off", "on" . . . ). The threshold value varies depending upon a number of factors including the identity of the materials that constitute the organic memory device, the thickness of the various layers, and the like. The voltage supply 702 is controllably employed to apply the threshold voltage in this aspect of the invention. However, other aspects of the invention can utilize other means to apply threshold voltages.

Generally speaking, the presence of an external stimuli such as an applied electric field that exceeds a threshold value ("on" state) permits an applied voltage to write, read, or erase information into/from the organic memory cell; whereas the absence of the external stimuli that exceeds a threshold value ("off" state) prevents an applied voltage to write or erase information into/from the organic memory cell.

To read information from the organic memory device, a voltage or electric field (e.g., 1 volts, 0.5 volts, 0.1 volts) is applied via the voltage source 702. Then, an impedance measurement is performed which, therein determines which operating state the memory device is in (e.g., high impedance, very low impedance, low impedance, medium impedance, and the like). As stated supra, the impedance relates to, for example, "on" (e.g., 1) or "off" (e.g., 0) for a dual state device or to "00", "01", "10", or "11" for a quad state device. It is appreciated that other numbers of states can provide other binary interpretations. To erase information written into the organic memory device, a negative voltage or a polarity opposite the polarity of the writing signal that exceeds a threshold value is applied.

FIG. 9 is a block diagram that depicts fabrication of a passive layer 800 in accordance with an aspect of the present invention. A $Cu_yS$ layer is formed by a gas phase reaction operation. A first layer 806 is formed that comprises Cu. A second layer 804 is formed on the first layer. The second layer comprises $Cu_yS$ (e.g., $Cu_2S$, CuS or mixture thereof) and has a thickness of about 20 Å or more. A third layer 802 is formed on the second layer 804. The third layer 802 contains $Cu_2O$, and/or CuO and generally has a thickness of about 10 Å or less. It is appreciated that alternate aspects of the invention can employ suitable variations in composition and thickness and still be in accordance with the present invention.

FIG. 10 is a block diagram illustrating an organic layer 900 formed by a chemical vapor deposition (CVD) process in accordance with an aspect of the present invention. The organic layer 900 is formed via a gas phase reaction process. Typically, the organic layer 900 is formed in contact with a passive layer and an electrode. The organic layer 900 is comprised of polymer polydiphenylacetylene (DPA). This polymer layer, as shown in FIG. 10, is fabricated to be about 65–75 Å thick.

Turning now to FIG. 11, a block diagram depicting another organic layer 1000 formed from a CVD process in accordance with an aspect of the present invention is illustrated. Once again, the organic layer 1000 is formed via a gas phase reaction process. The organic layer 1000 is formed in contact with a passive layer and an electrode. The organic polymer layer 1000 is comprised of polymer polyphenylacetylene (PPA). Referring to FIG. 12, a block diagram of another organic layer 1100 formed by spin coating in accordance with an aspect of the present invention is illustrated. The organic layer 1100 is formed via a spin coating process, instead of a gas phase reaction process. The organic layer 1100 is formed in contact with a passive layer and an electrode. The organic layer 1100 is comprised substantially of PPA and has a thickness of about 1000 Å. It is appreciated that various alternatives to and variations of the layers described in FIGS. 8–12 can be employed in accordance with the present invention.

What have been described above are one or more aspects of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. In addition, while a particular feature of the invention may have been disclosed with respect to only one of several implementations, such feature may be combined with one or more other features of the other implementations as may be desired and advantageous for any given or particular application. Furthermore, to the extent that the term "includes" is used in either the detailed description and the claims, such term is intended to be inclusive in a manner similar to the term "comprising".

What is claimed is:

1. An organic memory device, comprising:
   a first electrode;
   a selectively conductive media formed on the first electrode, the selectively conductive media comprising a passive layer formed on the first electrode and an organic layer formed on the passive layer, the organic layer formed within an opening in a subsequent layer; and
   at least one other electrode formed on the organic layer and operative with the first electrode to activate a selective memory portion in the organic layer.

2. The device of claim 1, the opening in a subsequent layer further comprises a via in an Inter Layer Dielectric (ILD).

3. The device of claim 1, the organic layer is formed as a three-dimensional structure having a plurality of selective memory portions.

4. The device of claim 3, further comprising a plurality of electrodes that cooperate with the first electrode to access the plurality of selective memory portions.

5. The device of claim 3, the three-dimensional structure is at least one of a cylinder, a column, a plane, a cube, an angular structure, a trapezoidal structure, and a polygonal structure.

6. The device of claim 3, the three-dimensional structure is partially filled with a dielectric material.

7. The device of claim 6, the three-dimensional structure is filled with about one half of the dielectric material and about one half of an organic material.

8. The device of claim 3, the plurality of selective memory portions having one or more available states representing one or more bits of information.

9. The device of claim 1, the organic layer is an organic polymer layer formed on the passive layer.

10. The device of claim 9, the passive layer comprising a plurality of individual passive layers.

11. The device of claim 9, the passive layer contains $Cu_2S$.

12. The device of claim 9, the organic layer being a conjugated organic material.

13. The device of claim 9, the organic layer being selected from the group comprising: polyacetylene, polyphenylacetylene, polydiphenylacetylene, polyaniline, poly(p-phenylene vinylene), polythiophene, polyporphyrins, porphyrinic macrocycles, thiol derivatized polyporphyrins, polymetallocenes, polyferrocenes, polyphthalocyanines, polyvinylenes, and polystiroles.

14. The device of claim 1, at least one of the first electrode and the other electrode comprising a material being selected from the group comprising: copper, coppr alloy, silver, silver alloy, aluminum, chromium, germanium, gold, magnesium, manganese, indium, iron, nickel, palladium, platinum, titanium, zinc, alloys thereof, indium-tin oxide, polysilicon, doped amorphous silicon, and metal silicides.

15. The device of claim 14, further comprising a barrier layer to substantially prevent diffusion of the electrode materials.

16. The device of claim 15, the barrier layer further comprising at least one of cobalt, chromium, nickel, palladium, tantalum, tantalum silicon nitride, titanium, titanium nitride, silicon nitride, tungsten nitride, and tungsten silicon nitride.

17. The device of claim 15, the at least one of the first electrode and the second electrode formed in accordance with at least one of a single damascene process and a dual damascene process.

18. The device of claim 1, further comprising a plurality memory cells, respective cells adapted in accordance with claim 1, the plurality of memory cells forming a non-volatile memory device.

19. The device of claim 18, further comprising one or more word lines to access the plurality of memory cells.

20. The device of claim 18, the non-volatile memory device employed as component in a computer system.

21. A method of fabricating an organic memory device, comprising:
   forming a first electrode;
   forming a selectively conductive media on the first electrode, the selectively conductive media comprising a passive layer formed on the first electrode;
   forming an organic layer on the passive layer, the organic layer formed within an opening in a subsequent layer; and
   forming at least one other electrode on the organic layer, the at least one other electrode operative with the first electrode to activate a selective memory portion in the organic layer.

22. The method of claim 21, further comprising forming a three-dimensional structure in the organic layer and partially filling the the three-dimensional structure with organic material to form a three-dimensional memory structure.

23. The method of claim 21, further comprising forming the first electrode and the at least one other electrode in accordance with at least one of a single damascene process and a dual damascene process.

24. The method of claim 23, further comprising forming a barrier layer to mitigate diffusion of the first electrode and the at least one other electrode into a subsequent layer.

25. The method of claim 21, further comprising forming at least one word line to access a plurality of memory cells fabricated in accordance with claim 21.

26. The method of claim 22, further comprising partially filling the three-dimensional structure in accordance with a chemical vapor deposition process.

27. The method of claim 22, further comprising partially filling the three-dimensional structure in accordance with a gas phase reaction process.

28. The method of claim 22, further comprising partially filling the the three-dimensional structure in accordance with a spin coating process.

29. A system for fabricating an organic memory device, comprising:

means for forming a first electrode;

means for forming a selectively conductive media on the first electrode, the selectively conductive media comprising a passive layer formed on the first electrode and an organic layer formed on the passive layer, the organic layer formed within an opening in a subsequent layer; and means for forming at least one other electrode on the organic layer and operative with the first electrode to activate a selective memory portion in the organic layer.

30. An organic memory device, comprising:

a first dielectric layer having at least one bit line;

a passive layer associated with the at least one bit line;

a second dielectric layer formed over the first dielectric layer, the second dielectric layer having an opening formed therein, the opening formed over the passive layer;

an organic semiconductor material that fills a first portion of the opening over the passive layer;

a dielectric material that fills a second portion of the opening over the organic semiconductor material; and at least two electrodes formed over the organic semiconductor material to form a multi-cell memory within selected portion of the organic semiconductor material.

31. The organic memory device of claim 30, further comprising a plurality of multi-cell memories packaged as an Integrated Circuit.

* * * * *